(12) United States Patent
Park et al.

(10) Patent No.: US 11,508,687 B2
(45) Date of Patent: Nov. 22, 2022

(54) SEMICONDUCTOR PACKAGE

(71) Applicant: SAMSUNG ELECTRONICS CO., LTD., Suwon-si (KR)

(72) Inventors: Minkyeong Park, Hwaseong-si (KR); Do-Hyun Kim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/950,211

(22) Filed: Nov. 17, 2020

(65) Prior Publication Data

US 2021/0249377 A1 Aug. 12, 2021

(30) Foreign Application Priority Data

Feb. 7, 2020 (KR) .................. 10-2020-0014866

(51) Int. Cl.
*H01L 23/00* (2006.01)
*H01L 25/18* (2006.01)
(Continued)

(52) U.S. Cl.
CPC .......... *H01L 24/73* (2013.01); *H01L 23/5381* (2013.01); *H01L 24/24* (2013.01); *H01L 24/32* (2013.01); *H01L 24/33* (2013.01); *H01L 24/48* (2013.01); *H01L 24/82* (2013.01); *H01L 24/83* (2013.01); *H01L 24/85* (2013.01); *H01L 24/92* (2013.01); *H01L 25/18* (2013.01); *H01L 25/50* (2013.01); *H01L 21/56* (2013.01); *H01L 2224/24011* (2013.01); *H01L 2224/24105* (2013.01); *H01L 2224/24226* (2013.01); *H01L 2224/24991* (2013.01); *H01L 2224/32145* (2013.01); *H01L 2224/32225* (2013.01); *H01L 2224/33181* (2013.01); *H01L 2224/48105* (2013.01); *H01L 2224/48145* (2013.01); *H01L 2224/48227* (2013.01); *H01L 2224/73215* (2013.01); *H01L 2224/73217* (2013.01); *H01L 2224/73227* (2013.01); *H01L 2224/73265* (2013.01); *H01L 2224/73267* (2013.01); *H01L 2224/82102* (2013.01); *H01L 2224/9202* (2013.01); *H01L 2224/92137* (2013.01);
(Continued)

(58) Field of Classification Search
CPC .................................................. H01L 25/0657
See application file for complete search history.

(56) References Cited

U.S. PATENT DOCUMENTS 6,476,506 B1 1/2002 O'Connor et al.
6,667,546 B2 12/2003 Huang et al.
(Continued)

FOREIGN PATENT DOCUMENTS

JP 3792554 7/2006
KR 10-1348024 1/2014

*Primary Examiner* — Jasmine J Clark
(74) *Attorney, Agent, or Firm* — F. Chau & Associates, LLC

(57) ABSTRACT

A semiconductor package may include a substrate including a first coupling terminal and a second coupling terminal, a first chip disposed on the substrate, the first chip including a first pad and a second pad, and a connection structure connecting the first coupling terminal to the first pad. A portion of the connection structure may be in contact with a first side surface of the first chip. The connection structure may include a connection conductor electrically connecting the first pad to the first coupling terminal.

20 Claims, 11 Drawing Sheets

(51) Int. Cl.
*H01L 25/00* (2006.01)
*H01L 23/538* (2006.01)
*H01L 21/56* (2006.01)

(52) U.S. Cl.
CPC ............... *H01L 2224/92244* (2013.01); *H01L 2224/92247* (2013.01)

(56) References Cited

U.S. PATENT DOCUMENTS

| | | |
|---|---|---|
| 6,806,936 B2 | 10/2004 | Nakaminami et al. |
| 8,203,204 B2 | 6/2012 | Kim |
| 8,203,219 B2 | 6/2012 | Wyland |
| 9,536,753 B2 | 1/2017 | Koto et al. |
| 2006/0153388 A1 | 7/2006 | Huang et al. |
| 2008/0203581 A1 | 8/2008 | Thomas et al. |
| 2014/0225276 A1* | 8/2014 | Ho ................... H01L 29/0657 257/774 |
| 2017/0092567 A1* | 3/2017 | Vincent ................ H01L 23/485 |

* cited by examiner

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2020-0014866, filed on Feb. 7, 2020, in the Korean Intellectual Property Office, the entire contents of which are hereby incorporated by reference.

FIELD

The present disclosure relates to a semiconductor package, and in particular, to a semiconductor package including a connection structure formed by a print process.

DISCUSSION OF RELATED ART

A semiconductor package is configured to allow a semiconductor chip to be easily used as a part of an electronic product. Typically, the semiconductor package includes a substrate (e.g., a printed circuit board (PCB)) and a semiconductor chip mounted on the substrate. Various methods are used to electrically connect the semiconductor chip to the substrate. For example, a wire bonding method may be used to electrically connect the semiconductor chip to the substrate. The wire is formed of or includes a conductive material to electrically connect elements, which are connected thereto, to each other.

With recent advances in the electronics industry, there is an increasing demand for high-performance, high-speed and compact electronic components. To meet the demand, sizes of semiconductor packages are decreasing. Accordingly, various semiconductor packaging techniques are being used. For example, a semiconductor package device may be configured to include a plurality of semiconductor chips mounted on a package substrate, or to have a structure in which a package is stacked on another package.

SUMMARY

An embodiment of the inventive concept provides a semiconductor package configured to use an inner pad, which is provided between two pads disposed at an outer portion of a chip. An embodiment of the inventive concept provides a semiconductor package having a connection structure preventing a wire-to-wire short circuit. An embodiment of the inventive concept provides a semiconductor package with a reduced size.

According to an embodiment of the inventive concept, a semiconductor package may include a substrate including a first coupling terminal and a second coupling terminal, a first chip disposed on the substrate, the first chip including a first pad and a second pad, and a connection structure connecting the first coupling terminal to the first pad. A portion of the connection structure may be in contact with a first side surface of the first chip. The connection structure may include a connection conductor electrically connecting the first pad to the first coupling terminal.

According to an embodiment of the inventive concept, a semiconductor package may include a substrate, a first chip disposed on the substrate, a first semiconductor chip disposed on the first chip, and a second semiconductor chip disposed on the first semiconductor chip. The first chip may include a first pad, a second pad, and a third pad. The substrate may include a first coupling terminal electrically connected to the first pad, a second coupling terminal electrically connected to the second pad, and a third coupling terminal electrically connected to the third pad. The first coupling terminal and the first pad may be connected to each other by a connection structure. The connection structure may be formed by a printing process. The connection structure may include a connection conductor electrically connecting the first pad to the first coupling terminal.

According to an embodiment of the inventive concept, a semiconductor package may include a substrate, a first chip disposed on the substrate, a second chip disposed on the first chip, a first stack, which is horizontally spaced apart from the first chip and is electrically connected to the first chip, and a second stack, which is disposed on the first stack and is electrically connected to the second chip. The first stack may include a first semiconductor chip disposed on the substrate and a second semiconductor chip disposed on the first semiconductor chip. The first chip may include a first pad, a second pad, and a third pad. The second pad may be disposed between the first pad and the third pad. The substrate may include a first coupling terminal electrically connected to the first pad, a second coupling terminal electrically connected to the second pad, and a third coupling terminal electrically connected to the third pad. The first coupling terminal and the first pad may be connected to each other by a connection structure. A portion of the connection structure may be in contact with a first side surface of the first chip. The connection structure may include a connection conductor electrically connecting the first pad to the first coupling terminal.

BRIEF DESCRIPTION OF THE DRAWINGS

Exemplary embodiments will be more clearly understood from the following descriptions taken in conjunction with the accompanying non-limiting drawings, in which.

It should be noted that these figures are intended to illustrate the general characteristics of methods, structure and/or materials utilized in certain exemplary embodiments and to supplement the written description provided below. These drawings are not, however, necessarily to scale and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of like reference indicia in the various drawings may indicate the presence of like elements.

DETAILED DESCRIPTION

Embodiments of the inventive concept will now be described more fully by way of non-limiting examples with reference to the accompanying drawings, in which exemplary embodiments are shown.

Figure 1:
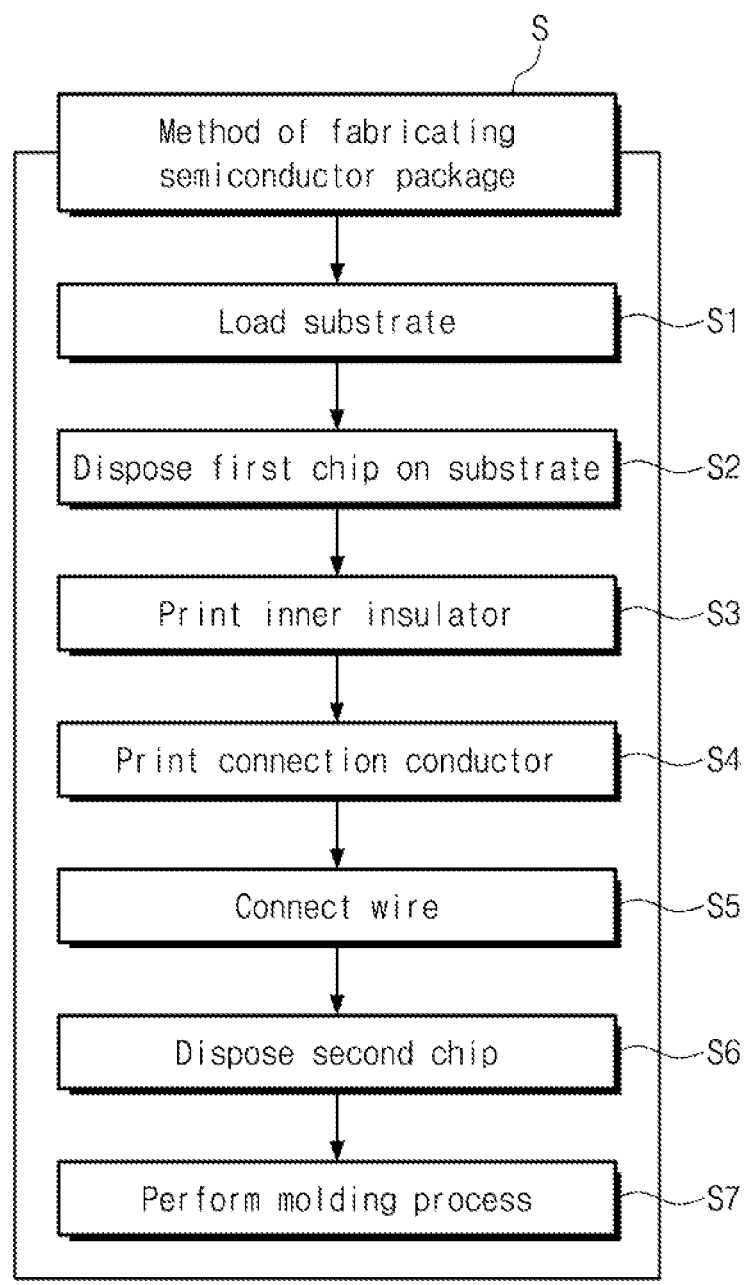
FIG. 1 is a flowchart diagram illustrating a method of fabricating a semiconductor package, according to an embodiment of the inventive concept.

FIG. 1 illustrates a method of fabricating a semiconductor package according to an embodiment of the inventive concept.

Referring to FIG. 1, a semiconductor package fabrication method S may include loading a substrate (in S1), disposing a first chip on the substrate (in S2), printing an inner insulator (in S3), printing a connection conductor (in S4), connecting one or more wires (in S5), disposing a second chip (in S6), and performing a molding process (in S7).

Hereinafter, each step of the semiconductor package fabrication method S may be described in greater detail with reference to FIGS. 2A to 2G.

FIGS. 2A to 2G sequentially illustrate a method of fabricating a semiconductor package according to an embodiment of the inventive concept.

Figure 2A:
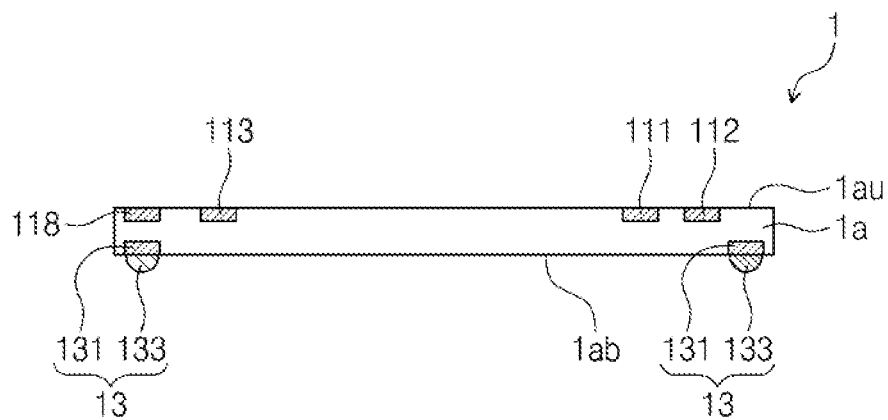
FIGS. 2A to 2G are structural diagrams with sectional side views sequentially illustrating a method of fabricating a semiconductor package, according to an embodiment of the inventive concept.

Referring to FIGS. 2A and 1, a substrate 1 may be loaded during the loading of the substrate (in S1). The substrate 1 may be loaded on a stage, for example. The substrate 1 may include a printed circuit board (PCB) or the like. The substrate 1 may include a substrate body 1$a$, a first coupling terminal 111, a second coupling terminal 112, a third coupling terminal 113, and at least one outer terminal 13, or the like. In an embodiment, the substrate 1 may further include an eighth coupling terminal 118 or the like.

The substrate body 1$a$ may include a top surface 1$au$ and a bottom surface 1$ab$. The top surface 1$au$ and the bottom surface 1$ab$ may be opposite to each other. A circuit interconnection line may be provided in the substrate body 1$a$. Coupling terminals and/or outer terminals may be electrically connected to each other through the circuit interconnection line in the substrate body 1$a$. Non-limiting examples of such connections may be described in greater detail with reference to FIGS. 7 and 8.

The first coupling terminal 111 may be coupled to the substrate body 1$a$. In an embodiment, a top surface of the first coupling terminal 111 may be coplanar with the top surface 1$au$ of the substrate body 1$a$. In an embodiment, the top surface of the first coupling terminal 111 may be located at a level that is higher than the top surface 1$au$ of the substrate body 1$a$ or at a level that is lower than the top surface 1$au$ of the substrate body 1$a$. The first coupling terminal 111 may be formed of or include a conductive material (e.g., metals). For example, the first coupling terminal 111 may be formed of or include at least one of aluminum (Al) or copper (Cu). The first coupling terminal 111 may be electrically connected to the circuit interconnection line or the like, which is provided in the substrate body 1$a$. In the present specification, the term "connection" may be used to mean that two elements are connected to each other directly or indirectly via one or more other elements. The first coupling terminal 111 may be electrically connected to other coupling terminals and/or outer terminals through the circuit interconnection line or the like. The first coupling terminal 111 may be disposed between the second coupling terminal 112 and the third coupling terminal 113. For example, the first coupling terminal 111 may be located between the second coupling terminal 112 and the third coupling terminal 113 when viewed in a plan view.

The second coupling terminal 112 may be coupled to the substrate body 1$a$. The second coupling terminal 112 may be coupled to the substrate body 1$a$ in substantially similar shape as the first coupling terminal 111. The second coupling terminal 112 may be formed of or include substantially similar material as the first coupling terminal 111. The second coupling terminal 112 may be electrically connected to the circuit interconnection line or the like, which is located in the substrate body 1$a$. The second coupling terminal 112 and the third coupling terminal 113 may be located on opposite sides of the substrate body 1$a$ relative to the position of the first coupling terminal 111.

The third coupling terminal 113 may be coupled to the substrate body 1$a$. The third coupling terminal 113 may be coupled to the substrate body 1$a$ in substantially similar shape as the first coupling terminal 111. The third coupling terminal 113 may be formed of or include substantially similar material as the first coupling terminal 111. The third coupling terminal 113 may be electrically connected to the circuit interconnection line or the like, which is provided in the substrate body 1$a$. The third coupling terminal 113 may be opposite to the second coupling terminal 112 relative to the position of the first coupling terminal 111.

The eighth coupling terminal 118 may be coupled to the substrate body 1$a$. The eighth coupling terminal 118 may be coupled to the substrate body 1$a$ in substantially similar shape as the first coupling terminal 111. The eighth coupling terminal 118 may be formed of or include substantially similar material as the first coupling terminal 111. The eighth coupling terminal 118 may be electrically connected to the circuit interconnection line or the like, which is provided in the substrate body 1$a$. This may be described in greater detail with reference to FIG. 8.

The outer terminal 13 may be coupled to the substrate body 1$a$. For example, the outer terminal 13 may be coupled to a portion of the bottom surface 1$ab$ of the substrate body 1$a$. The outer terminal 13 may include a lower coupling terminal 131 and a coupling ball 133. The lower coupling terminal 131 may be formed of or include a conductive material, such as aluminum (Al) and/or copper (Cu). The lower coupling terminal 131 may be electrically connected to the circuit interconnection line or the like, which is provided in the substrate body 1$a$. The lower coupling terminal 131 may be electrically connected to the coupling terminals 111, 112, and/or 113 through the circuit interconnection line or the like. The coupling ball 133 may be coupled to a bottom surface of the lower coupling terminal 131. The coupling ball 133 may be formed of or include a conductive material (e.g., a solder). In an embodiment, a plurality of the outer terminals 13 may be provided. Each of the outer terminals 13 may be spaced apart from each other in an extension direction of the substrate body 1$a$. For ease of description, the description that follows may refer to a single outer terminal 13.

Figure 2B:
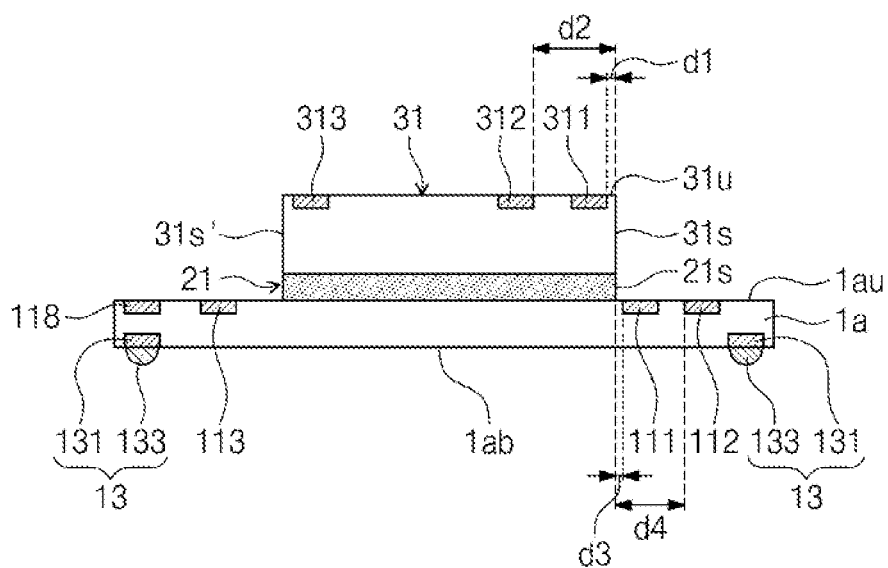

Referring to FIGS. 2B and 1, the disposing of the first chip on the substrate (in S2) may include disposing a first chip 31 on the substrate 1 with an adhesive layer 21 interposed therebetween.

The adhesive layer 21 may be disposed on the substrate 1. In an embodiment, the adhesive layer 21 may be in contact with the top surface 1$au$ of the substrate body 1$a$. The adhesive layer 21 may be formed of or include an adhesive material. For example, the adhesive layer 21 may include a die attach film (DAF) or the like. The adhesive layer 21 may be used to fasten the first chip 31 on the substrate 1. In other words, the first chip 31 may be disposed on the substrate 1 with the adhesive layer 21 interposed therebetween.

The first chip 31 may be disposed on the adhesive layer 21. The first chip 31 may be coupled to the substrate 1 by the adhesive layer 21. In an embodiment, the first chip 31 may include a master chip or the like. The first chip 31 may include a buffer circuit provided therein. In this case, the first chip 31 may serve as a buffer chip. The first chip 31 may include a top surface 31u, a first side surface 31s, and a second side surface 31s'. The first side surface 31s and the second side surface 31s' may be side surfaces that are opposite to each other. The first chip 31 may include a first pad 311, a second pad 312, and a third pad 313. The first, second, and third pads 311, 312, and 313 may be provided near the top surface 31u of the first chip 31. In an embodiment, the first, second, and third pads 311, 312, and 313 may be exposed to the outside, on the top surface 31u of the first chip 31. The top surface of each of the first, second, and third pads 311, 312, and 313 may be located at substantially the same level as the top surface 31u of the first chip 31. In an embodiment, a height of the top surface of each of the first, second, and third pads 311, 312, and 313 may be higher or lower than a height of the top surface 31u of the first chip 31. Each of the first, second, and third pads 311, 312, and 313 may be formed of or include a conductive material. For example, each of the first, second, and third pads 311, 312, and 313 may be formed of or include aluminum (Al) and/or copper (Cu). The first pad 311 may be disposed near the first side surface 31s of the first chip 31. That is, the first pad 311 may be closer to the first side surface 31s than the second pad 312 and the third pad 313. For example, a distance d1 between the first pad 311 and the first side surface 31s may be smaller than a distance d2 between the second pad 312 and the first side surface 31s. In an embodiment, the distance d1 between the first pad 311 and the first side surface 31s may be substantially close to zero. In the case where the distance d2 between the second pad 312 and the first side surface 31s is smaller than half of a horizontal length of the first chip 31, the second pad 312 may be located in an inner region of a chip, compared with the first pad 311. That is, the first pad 311 may be located in an outer region of the chip, compared with the second pad 312. The third pad 313 may be disposed near the second side surface 31s'. That is, the third pad 313 may be closer to the second side surface 31s' than the second pad 312. Thus, the second pad 312 may be formed, placed or disposed between the first pad 311 and the third pad 313, when viewed in a plan view. The first chip 31 may include an integrated circuit, which is provided therein, or the like. The integrated circuit, which is provided in the first chip 31, may be electrically connected to the first, second, and third pads 311, 312, and 313 or the like.

The first chip 31 may be disposed on the substrate 1 in such a way that the first side surface 31s is closer to the first coupling terminal 111 of the substrate 1 than to the second coupling terminal 112. Thus, a distance d3 between the first coupling terminal 111 and the first side surface 31s may be smaller than a distance d4 between the second coupling terminal 112 and the first side surface 31s. The third coupling terminal 113 may be close to the second side surface 31s'. Thus, the first chip 31 may be placed between the first coupling terminal 111 and the third coupling terminal 113, when viewed in a plan view. In an embodiment, the distance d3 between the first coupling terminal 111 and the first side surface 31s may be substantially close to zero.

In an embodiment, a first adhesion side surface 21s of the adhesive layer 21 may be substantially coplanar with the first side surface 31s of the first chip 31. But the inventive concept is not limited to this example.

Figure 2C:
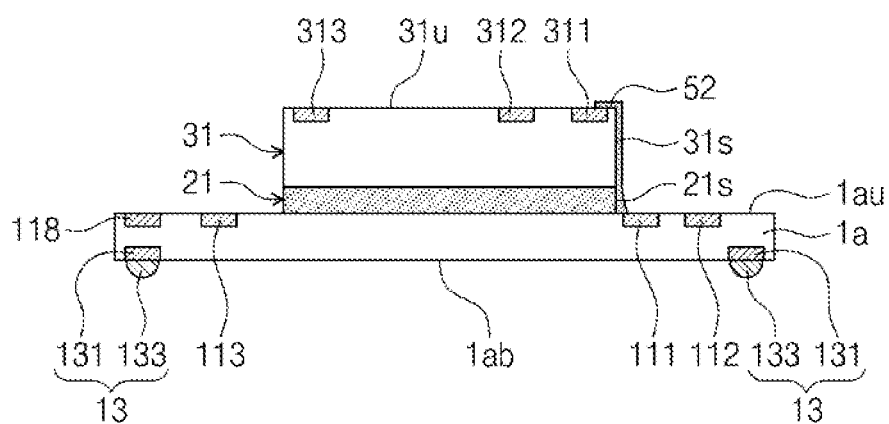

Referring to FIGS. 2C and 1, the printing of the inner insulator (in S3) may include forming an inner insulator 52 on the first chip 31 and/or the substrate 1. For example, the inner insulator 52 may be provided on a portion of the first pad 311, a portion of the top surface 31u of the first chip 31, the first side surface 31s of the first chip 31, the first adhesion side surface 21s of the adhesive layer 21, the top surface 1au of the substrate 1, and/or a portion of the first coupling terminal 111. In an embodiment, a portion of the inner insulator 52 may be in contact with a partial or whole portion of the first side surface 31s of the first chip 31. The inner insulator 52 may be provided to expose a portion of the first pad 311. The inner insulator 52 may be provided to expose a portion of the first coupling terminal 111.

The inner insulator 52 may be formed on the first chip 31 and/or the substrate 1 by a print process. The inner insulator 52 may be formed by various print processes. For example, the inner insulator 52 may be formed by an ink jet print process, an electro hydrodynamic jet print process, and/or an aerosol jet print process.

The inner insulator 52 may be formed of or include a material with a heat resistant property. The inner insulator 52 may include various electrically insulating materials. For example, the inner insulator 52 may be formed of or include a material formed using a solder resist ink. However, the inventive concept is not limited to this example, and the inner insulator 52 may be formed of or include a material formed using various liquid insulating materials.

Figure 2D:
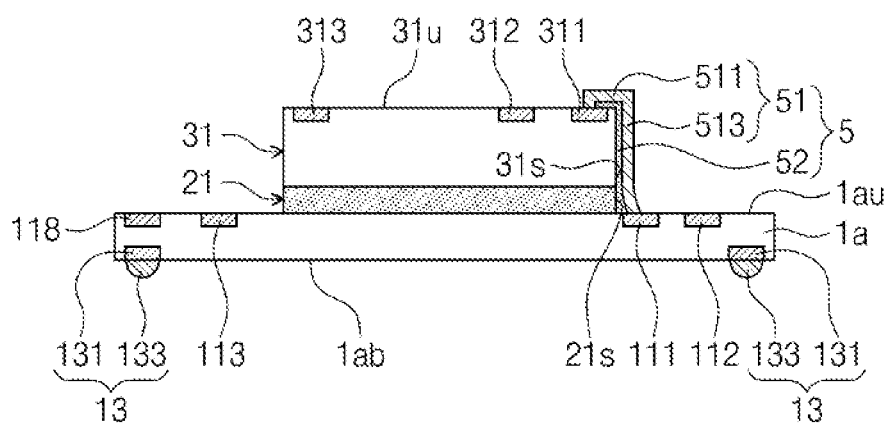

Referring to FIGS. 2D and 1, the printing of the connection conductor (in S4) may include forming a connection conductor 51 on the inner insulator 52. A structure including the connection conductor 51 and the inner insulator 52 will be referred to as a connection structure 5. The connection conductor 51 may include an upper conductor 511, which is placed on the first chip 31, and a lower conductor 513, which is extended downward from the upper conductor 511. The upper conductor 511 may be in contact with the first pad 311. The lower conductor 513 may be in contact with the first coupling terminal 111. Thus, the connection conductor 51 may electrically connect the first pad 311 to the first coupling terminal 111. The inner insulator 52 may be located between the connection conductor 51 and the first chip 31.

The connection conductor 51 may be formed on the first chip 31 and/or the substrate 1 by a print process. The connection conductor 51 may be formed by various print processes. For example, the connection conductor 51 may be formed by an ink jet print process, an electro hydrodynamic jet print process, and/or an aerosol jet print process.

The connection conductor 51 may be formed of or include various conductive materials. For example, the connection conductor 51 may be formed of or include at least one of aluminum (Al), copper (Cu), and/or gold (Au). However, the inventive concept is not limited to this example, and the connection conductor 51 may be formed of or include other metallic or non-metallic electrically conductive material.

Figure 2E:
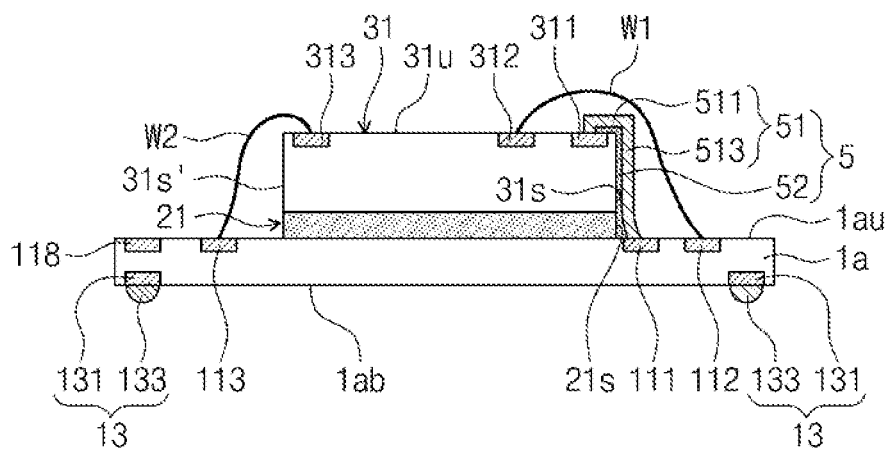

Referring to FIGS. 2E and 1, the connecting of the wires (in S5) may include connecting a first wire W1 and a second wire W2 to the substrate 1 and the first chip 31. The first wire W1 may electrically connect the second pad 312 to the second coupling terminal 112. To do this, the first wire W1 may be formed of or include a conductive material. For example, the first wire W1 may be formed of or include at least one of aluminum (Al), copper (Cu), and/or gold (Au). The first wire W1 should not be in direct contact with the connection structure 5 unless, such as in an alternate embodiment, the first wire W1 is replaced with another connection structure or is otherwise electrically insulated from connection structure 5. For example, the first wire W1 should not be in direct contact with the connection conductor 51. Thus, the first wire W1 and the connection conductor 51 may be electrically disconnected and/or insulated from each other.

The second wire W2 may electrically connect the third pad 313 to the third coupling terminal 113. To do this, the second wire W2 may be formed of or include a conductive material. For example, the second wire W2 may be formed of or include at least one of aluminum (Al), copper (Cu), and/or gold (Au). If the second side surface 31s' has any exposed conductors thereon, the second wire W2 should not be in direct contact with the second side surface 31s' unless, such as in an alternate embodiment, the second wire W2 is replaced with another connection structure or is otherwise electrically insulated from the second side surface 31s'.

Figure 2F:
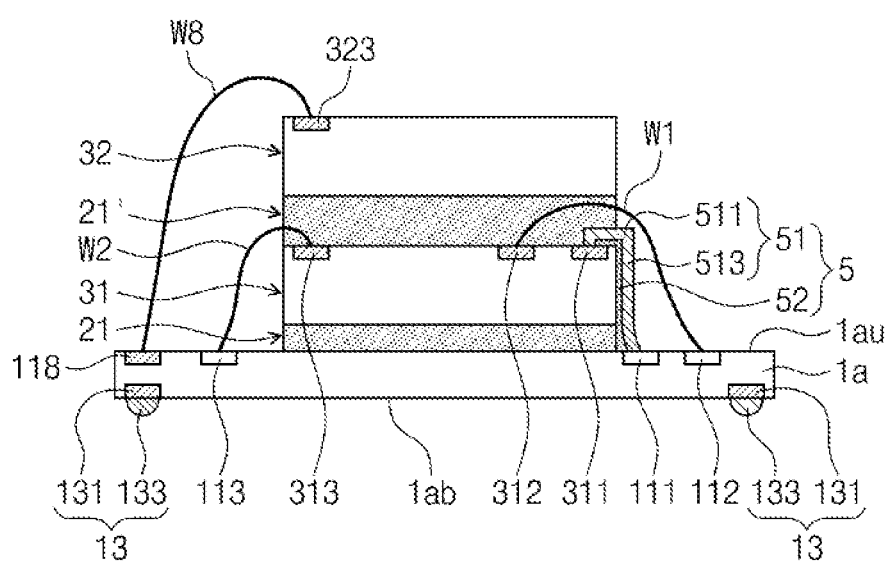

Referring to FIGS. 2F and 1, the disposing of the second chip (in S6) may include stacking a second chip 32 on the first chip 31. For example, the second chip 32 may be fastened to the first chip 31 by an adhesive layer 21'. The adhesive layer 21' may be substantially similar to the adhesive layer 21 described with reference to FIG. 2B, in terms of material and/or function, so duplicate description may be omitted. For example, the adhesive layer 21' may be formed of substantially similar material to the adhesive layer 21, but may be thicker to accommodate the wire W1.

In an embodiment, a portion of the connection structure 5, a portion of the first wire W1, and a portion of the second wire W2 may be placed in the adhesive layer 21'. The second chip 32 may include a sixth pad 323 or the like. The sixth pad 323 may be formed of or include a conductive material. For example, the sixth pad 323 may be formed of or include at least one of aluminum (Al) and/or copper (Cu). The sixth pad 323 may be electrically connected to the eighth coupling terminal 118 through an eighth wire W8. Accordingly, the second chip 32 may be electrically connected to the substrate 1. This may be described in greater detail with reference to FIG. 8.

Figure 2G:
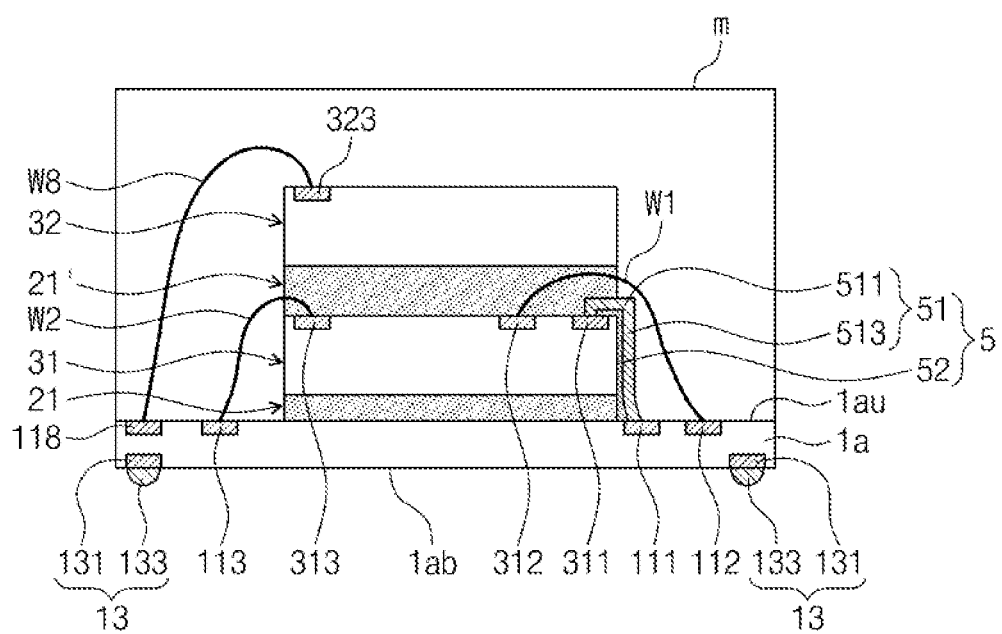

Referring to FIGS. 2G and 1, the molding process (in S7) may include forming a mold layer m, when the stacking and any wiring of the second chip 32 is finished. The mold layer m may protect the first chip 31 and the second chip 32 from the outside. The first chip 31 and the second chip 32 may be protected from external heat, moisture, and/or impact by the mold layer m. The mold layer m may be formed of or include an insulating polymer. For example, the mold layer m may be formed of or include an epoxy molding compound (EMC). However, the inventive concept is not limited to this example, and the mold layer m may include other insulating materials. The molding process may be performed by placing the substrate 1, on which the second chip 32 is stacked, into a cast, and injecting a material for the mold layer m into the cast. In an embodiment, the mold layer m may be disposed between the connection conductor 51 and the first wire W1.

In a method of fabricating a semiconductor package according to an embodiment of the inventive concept and a semiconductor package fabricated thereby, a pad of a chip may be connected to a coupling terminal of a substrate by a connection structure formed by a print process. Accordingly, it may be possible to electrically connect the two elements to each other, even when a wire is not used. A pad, which is disposed in an outer region of the chip, may be connected to the coupling terminal of the substrate by a connection conductor, which has a relatively small height and a rigid property. Thus, even when a wire is provided for connection with another pad disposed in an inner region of the chip to the substrate, a short circuit may not be formed between the wires. That is, even when there are pads provided in the outer regions of the chip, a wire may be used for connection with an inner pad, which is disposed between the two pads to the substrate.

In a method of fabricating a semiconductor package according to an embodiment of the inventive concept and a semiconductor package fabricated thereby, even when a chip is stacked on another chip, it may be possible to prevent a short circuit from being formed between wires by using one or more connection structures instead of one or more wires. Accordingly, it may be possible to facilitate the stacking of the semiconductor chips, which is performed during the fabrication of the semiconductor package. This may make it possible to reduce a size of the semiconductor package.

Figure 3:
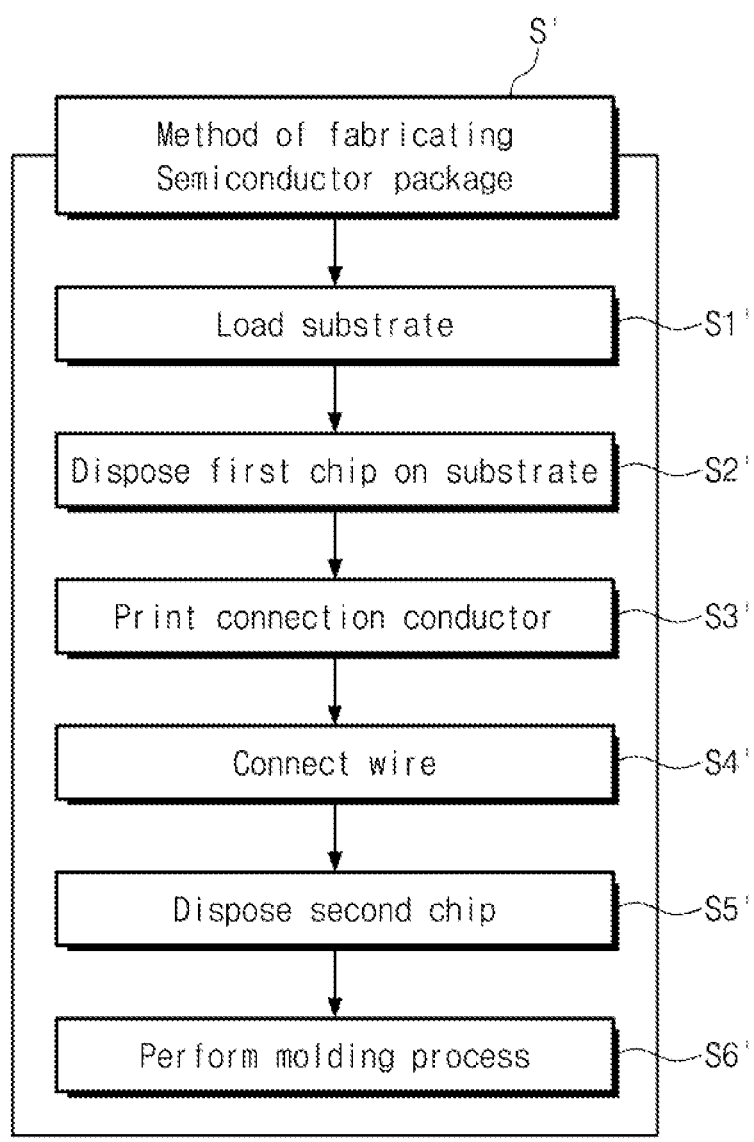
FIG. 3 is a flowchart diagram illustrating a method of fabricating a semiconductor package, according to an embodiment of the inventive concept.

FIG. 3 illustrates a method of fabricating a semiconductor package, according to an embodiment of the inventive concept.

In the following description, elements described with reference to FIGS. 1 to 2G may be identified by the same or like reference numbers, without repeating an overlapping description thereof.

Referring to FIG. 3, a semiconductor package fabrication method S' may include loading a substrate (in S1'), disposing a first chip on the substrate (in S2'), printing a connection conductor (in S3'), connecting wires (in S4'), disposing a second chip (in S5'), and performing a molding process (in S6').

When compared with the semiconductor package fabrication method S described with reference to FIG. 1, the printing of the inner insulator (in S3) may be omitted. Hereinafter, a structure of a semiconductor package, which is fabricated by the semiconductor package fabrication method S' of FIG. 3, may be described in greater detail with reference to FIG. 4.

Figure 4:
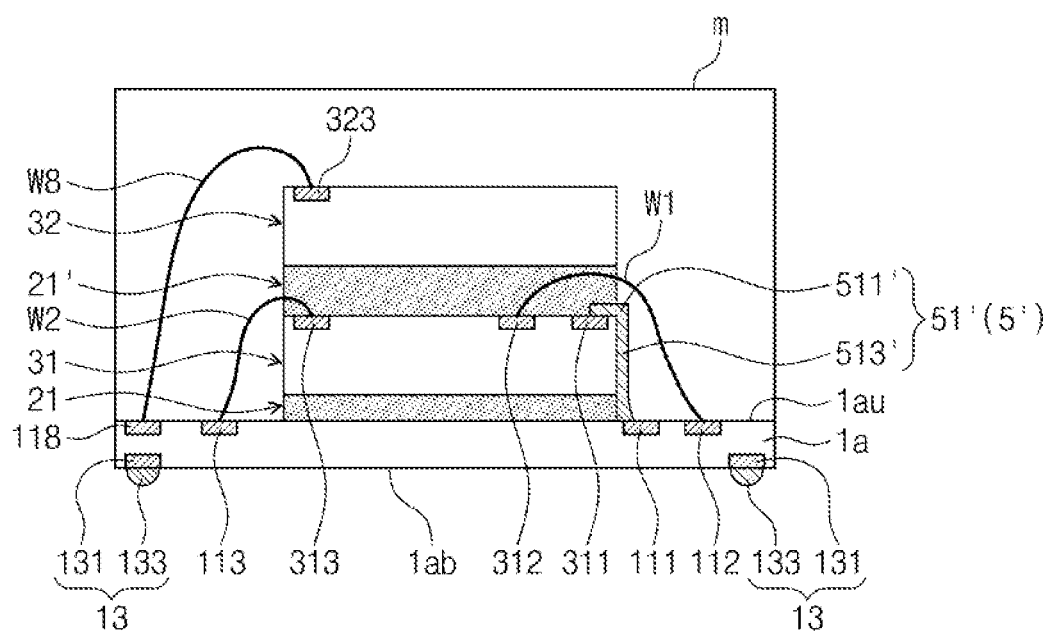
FIG. 4 is a structural diagram with sectional side view illustrating a semiconductor package according to an embodiment of the inventive concept.

FIG. 4 illustrates a semiconductor package according to an embodiment of the inventive concept.

Referring to FIG. 4, a connection structure 5' may include a connection conductor 51'. The connection conductor 51' may include an upper conductor 511' and a lower conductor 513'. The inner insulator of FIGS. 2C through 2G may be omitted. In this case, the connection structure 5' and the connection conductor 51' may indicate the same element. The connection conductor 51' may be in contact with the first side surface 31s of the first chip 31. For example, the connection conductor 51' may be in contact with the first pad 311, a top surface of the first chip 31, the first side surface 31s, the first adhesion side surface 21s, the top surface of the substrate 1, and/or the first coupling terminal 111. Thus, the connection conductor 51' may electrically connect the first pad 311 of the first chip 31 to the first coupling terminal 111 of the substrate 1.

In a method of fabricating a semiconductor package according to an embodiment of the inventive concept and a semiconductor package fabricated thereby, the inner insulator may be omitted, and the fabrication process may be more simplified. This may be applied, for example, where the first side surface 31s has no exposed conductors thereon. Thus, a semiconductor package fabrication may be quickly executed.

Figure 5:
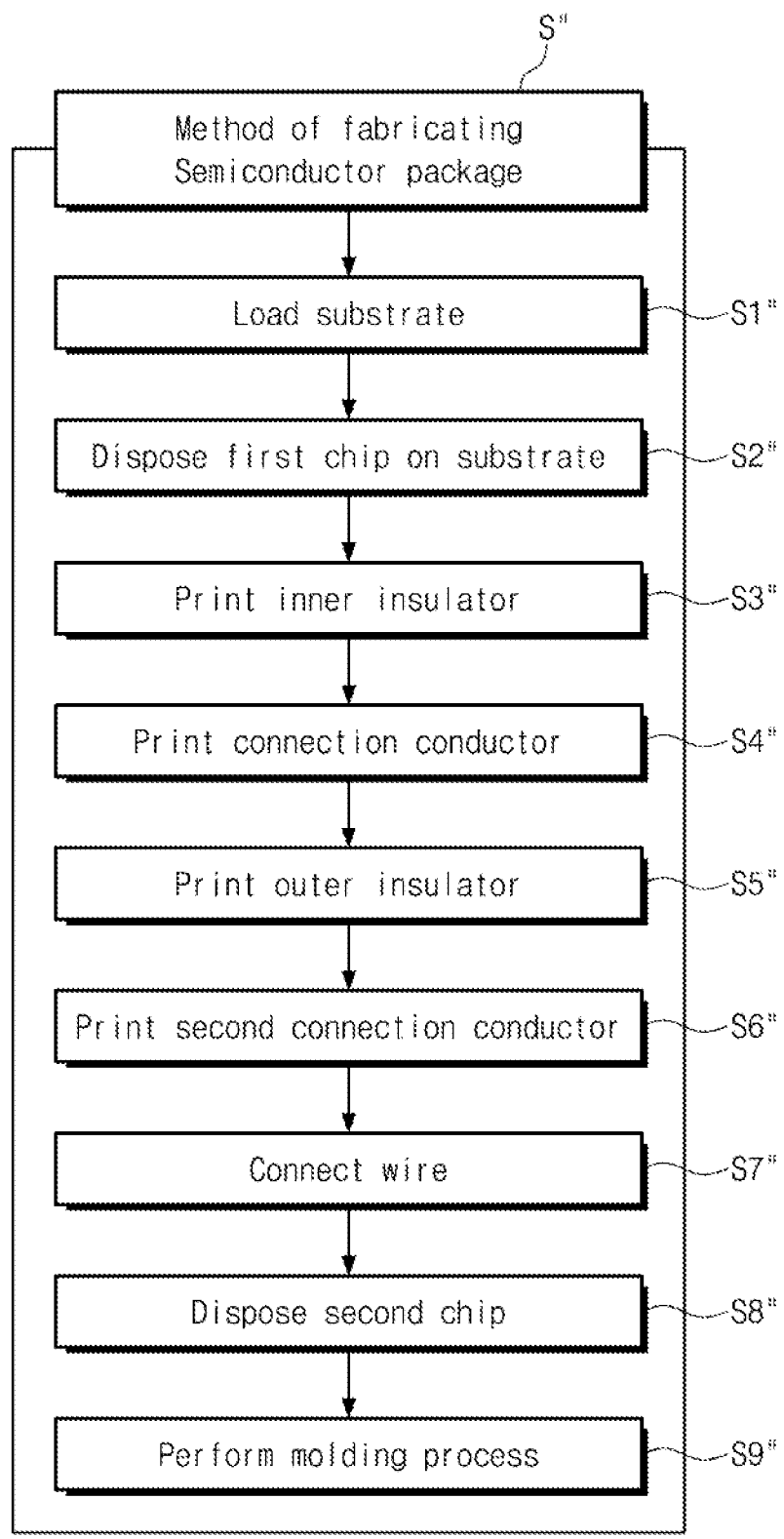
FIG. 5 is a flowchart diagram illustrating a method of fabricating a semiconductor package, according to an embodiment of the inventive concept.

FIG. 5 illustrates a method of fabricating a semiconductor package, according to an embodiment of the inventive concept.

In the following description, like elements described with reference to FIGS. 1 to 2G may be identified by the same or like reference numbers, without repeating an overlapping description thereof.

Referring to FIG. 5, a semiconductor package fabrication method S" may include loading a substrate (in S1"), disposing a first chip on the substrate (in S2"), printing an inner insulator (in S3"), printing a connection conductor (in S4"), printing an outer insulator (in S5"), printing a second connection conductor (in S6"), connecting wires (in S7"), disposing a second chip (in S8"), and performing a molding process (in S9").

Hereinafter, a semiconductor package, which is fabricated by the semiconductor package fabrication method, will be described in more detail with reference to FIG. 6.

Figure 6:
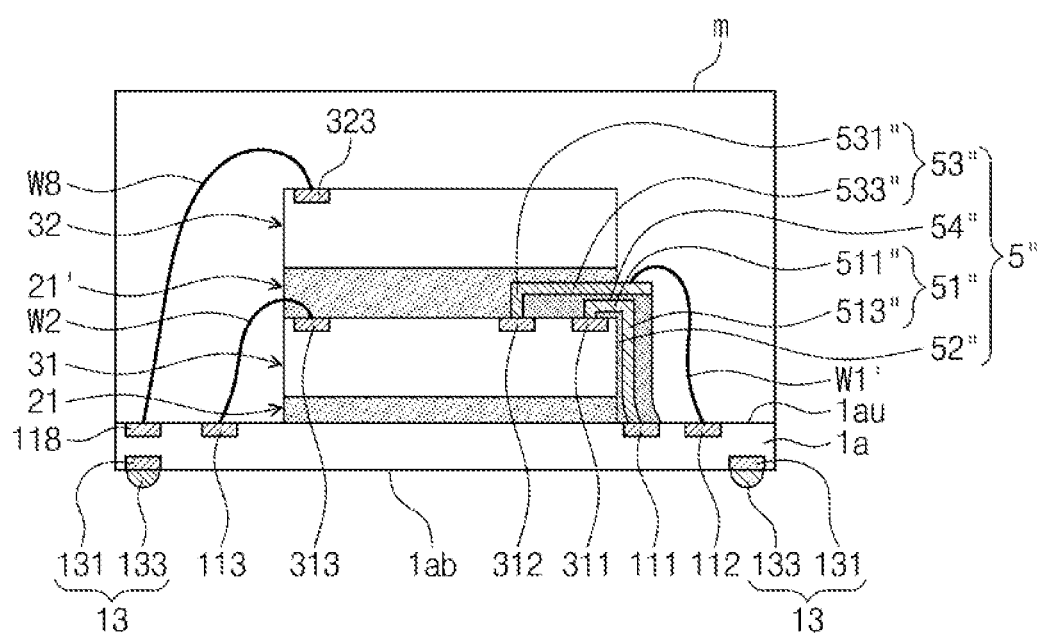
FIG. 6 is a structural diagram with sectional side view illustrating a semiconductor package according to an embodiment of the inventive concept.

FIG. 6 illustrates a semiconductor package according to an embodiment of the inventive concept.

Referring to FIG. 6, a connection structure 5" may include an inner insulator 52", a connection conductor 51", an outer insulator 54", and a second connection conductor 53".

The inner insulator 52" may be formed by the printing of the inner insulator (in S3" of FIG. 5). The inner insulator 52" and the printing of the inner insulator (in S3") may be substantially similar to the inner insulator 52 and the printing of the inner insulator (in S3) described with reference to FIGS. 1 to 2G, so duplicate description may be omitted.

The connection conductor 51" may be formed by the printing of the connection conductor (in S4" of FIG. 5). The connection conductor 51" and the printing of the connection conductor (in S4") may be substantially similar to the connection conductor 51 and the printing of the connection conductor (in S4) described with reference to FIGS. 1 to 2G, so duplicate description may be omitted. Thus, the connection conductor 51" may include an upper conductor 511" and a lower conductor 513".

The outer insulator 54" may be formed by the printing of the outer insulator (in S5" of FIG. 5). The outer insulator 54" may be formed on the connection conductor 51" by a print process. The outer insulator 54" may be formed by various print processes. For example, the outer insulator 54" may be formed by an ink jet print process, an electro hydrodynamic jet print process, and/or an aerosol jet print process.

The outer insulator 54" may be formed of or include a material with a heat resistant property. The outer insulator 54" may include various electrically insulating materials. For example, the outer insulator 54" may be formed of or include a solder resist ink or the like. However, the inventive concept is not limited to this example, and the outer insulator 54" may include various liquid insulating materials.

The outer insulator 54" may cover portions of the top surface of the first chip 31, the first pad 311, the second pad 312, the connection conductor 51", the first coupling terminal 111, and/or the top surface of the substrate 1. The outer insulator 54" may be in contact with the top surface of the first chip 31, the first pad 311, the second pad 312, the connection conductor 51", the first coupling terminal 111, and/or the top surface of the substrate 1. The outer insulator 54" may protect the connection conductor 51". The outer insulator 54" may expose at least a portion of the second pad 312. The outer insulator 54" may expose at least a portion of the second coupling terminal 112. In an alternate embodiment, any portion of the outer insulator 54" adjacent to the lower conductor 513" may be omitted.

The second connection conductor 53" may be formed by the printing of the second connection conductor (in S6" of FIG. 5). The second connection conductor 53" may be formed on the portion of the outer insulator 54" overlapping the upper conductor 511" by a print process. The second connection conductor 53" may be formed by various print processes. For example, the second connection conductor 53" may be formed by an ink jet print process, an electro hydrodynamic jet print process, and/or an aerosol jet print process.

The second connection conductor 53" may include various conductive materials. For example, the second connection conductor 53" may be formed of or include aluminum (Al), copper (Cu), and/or gold (Au). However, the inventive concept is not limited to this example, and the second connection conductor 53" may include at least one of other metallic materials.

The second connection conductor 53" may include a coupling portion 531" and an extended portion 533". The coupling portion 531" may be placed on the second pad 312. The coupling portion 531" may be extended upward from the second pad 312. The coupling portion 531" may be electrically connected to the second pad 312. The extended portion 533" may be extended from the coupling portion 531" to the outside of the adhesive layer 21'. The extended portion 533" may be placed on the outer insulator 54". A portion of the extended portion 533" may be exposed to the outside of the adhesive layer 21'.

A first wire W1' may be connected to the extended portion 533" of the second connection conductor 53". The first wire W1' may be electrically connected to the second pad 312 through the second connection conductor 53". The second pad 312 may be electrically connected to the second coupling terminal 112.

The second connection conductor 53" may be electrically separated from the connection conductor 51" by the outer insulator 54". In other words, the second connection conductor 53" may be electrically disconnected and/or insulated from the connection conductor 51".

In a method of fabricating a semiconductor package according to an embodiment of the inventive concept and a semiconductor package fabricated thereby, the first wire may be connected to the second connection conductor extended from the second pad. Thus, the first wire W1' may avoid placement in the adhesive layer. Accordingly, a thickness of the adhesive layer may be reduced. Furthermore, a total thickness of the semiconductor package may be reduced. In an alternate embodiment, the second connection conductor 53" may extend to the second coupling terminal 112, and the first wire W1' may be omitted.

In a method of fabricating a semiconductor package according to an embodiment of the inventive concept and a semiconductor package fabricated thereby, the connection conductor may be protected by the outer insulator. The connection conductor may be prevented from being in contact with the second connection conductor by the outer insulator.

Figure 7:
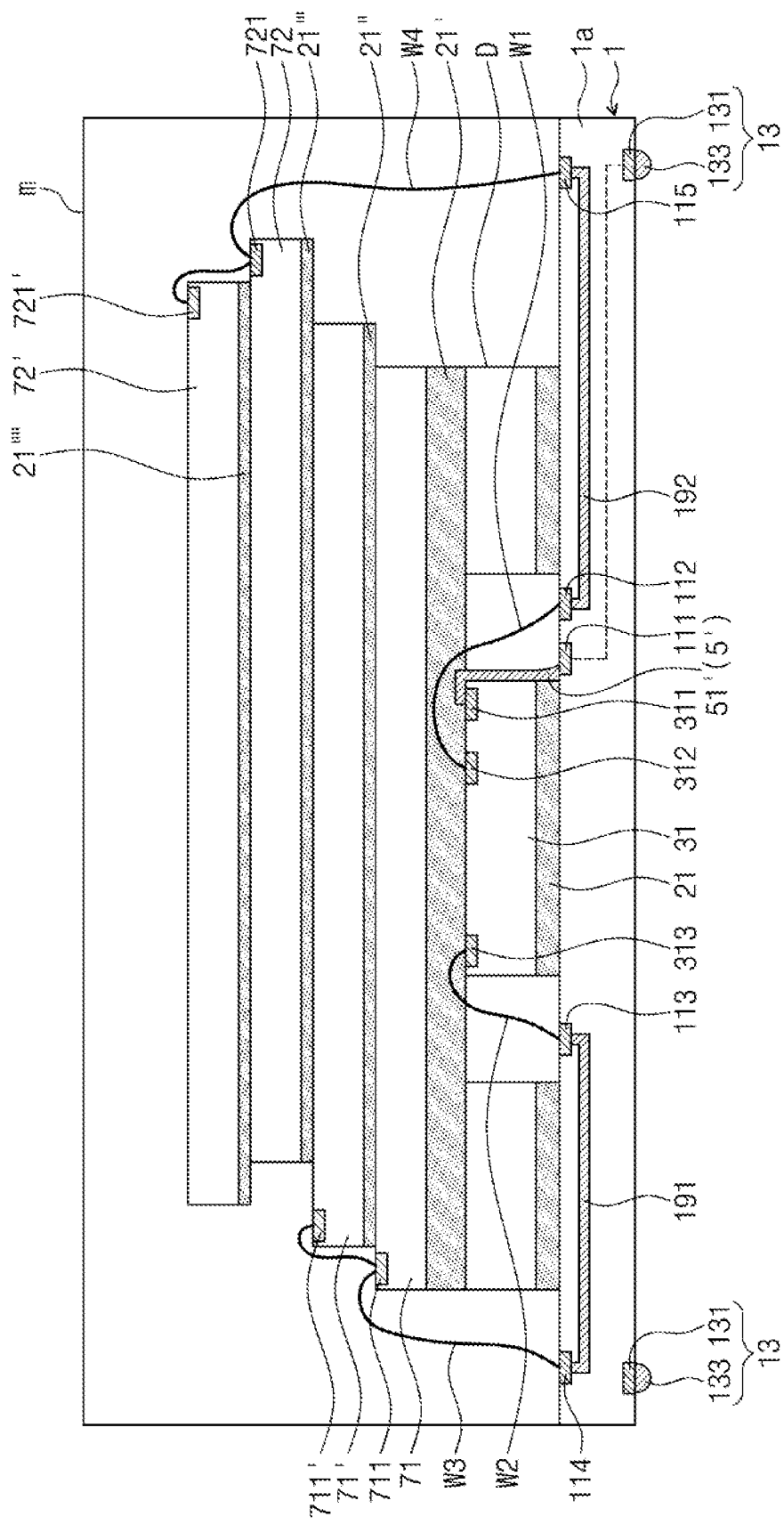
FIG. 7 is a structural diagram with sectional side view illustrating a semiconductor package according to an embodiment of the inventive concept.

FIG. 7 illustrates a semiconductor package according to an embodiment of the inventive concept.

In the following description, like elements described with reference to FIGS. 1 to 6 may be identified by the same or like reference numbers, without repeating an overlapping description thereof.

Referring to FIG. 7, the semiconductor package may include the first chip 31, a dummy chip D, a first semiconductor chip 71, a second semiconductor chip 72, the substrate 1, the connection structure 5', the first wire W1, the second wire W2, a third wire W3, a fourth wire W4, and/or the like.

The first chip 31 may include a master chip or the like. The first chip 31 may include a buffer circuit provided therein. In this case, the first chip 31 may serve as a buffer chip. The first chip 31 may be substantially similar to the first chip described with reference to FIG. 4, so duplicate description may be omitted.

The dummy chip D may be placed on the substrate 1 at a level comparable to the first chip 31. An integrated circuit need not be provided in the dummy chip D. The dummy chip D need not be electrically connected to other elements. The dummy chip D may be horizontally spaced apart from the first chip 31. A level of a top surface of the dummy chip D may be equal or similar to a level of a top surface of the first chip 31. The dummy chip D, along with the first chip 31, may support the first semiconductor chip 71 or the like.

The first semiconductor chip 71 may be placed on the first chip 31. The first semiconductor chip 71 may be fastened to the first chip 31 by the adhesive layer 21' interposed therebetween. In the case where the first chip 31 is the master chip, the first semiconductor chip 71 may be a slave chip. The slave chip may exchange signals with the outside through the master chip. The first semiconductor chip 71 may include a first semiconductor pad 711. The first semiconductor pad 711 may be exposed to the outside through a top surface of the first semiconductor chip 71. In an embodiment, a plurality of first semiconductor chips, 71 and 71' or the like with semiconductor pads 711 and 711' or the like, may be provided. The first semiconductor chips 71 may be stacked in a vertical direction. The first semiconductor chips 71 may be attached to each other by the adhesive layer 21" interposed therebetween. The first semiconductor chips 71 may be stacked in a staircase shape in such a way that each of the first semiconductor chips 71 exposes the first semiconductor pad 711 thereunder. In other words, a stacking direction of the first semiconductor chips 71, 71' or the like, may be shifted in a first direction. The first direction may be a direction that is parallel to the top surface of the substrate. In an alternate embodiment, the first semiconductor chips 71 may be stacked in a zig-zag shape. For the sake of brevity, the description that follows will refer to one of the first semiconductor chips 71.

The second semiconductor chip 72 may be placed on the first semiconductor chip 71. The second semiconductor chip 72 may be fastened to the first semiconductor chip 71 by the adhesive layer 21''' interposed therebetween. In the case where the first chip 31 is the master chip, the second semiconductor chip 72 may be the slave chip. The second semiconductor chip 72 may include a second semiconductor pad 721. The second semiconductor pad 721 may be exposed to the outside through a top surface of the second semiconductor chip 72. In an embodiment, a plurality of the second semiconductor chips, 72 and 72' or the like with semiconductor pads 712 and 712' or the like, may be provided. The second semiconductor chips 72 may be stacked in the vertical direction. The second semiconductor chips 72 may be attached to each other by the adhesive layer 21"" interposed therebetween. The second semiconductor chips 72 may be stacked in a staircase shape in such a way that each of the second semiconductor chips 72 exposes the second semiconductor pad 721 thereunder. In an embodiment, the second semiconductor chips 72 may form a staircase structure in a tilting direction that is opposite to a tilting direction of the staircase structure of the first semiconductor chips 71. In an alternate embodiment, the second semiconductor chips 72 may be stacked in a zig-zag shape. For the sake of brevity, the description that follows will refer to one of the second semiconductor chips 72.

The substrate 1 may include the first coupling terminal 111, the second coupling terminal 112, the third coupling terminal 113, a fourth coupling terminal 114, a fifth coupling terminal 115, one or more of the outer terminals 13, a first inner interconnection line 191, a second inner interconnection line 192, or the like. The first to fifth coupling terminals 111 to 115 may be configured to have substantially similar features to the coupling terminals described with reference to FIG. 2A, so duplicate description may be omitted. The fourth coupling terminal 114, the third coupling terminal 113, the first coupling terminal 111, the second coupling terminal 112, and the fifth coupling terminal 115 may be sequentially disposed from the left side to the right side.

The connection structures between the first, second, and third coupling terminals 111, 112, and 113 and the first, second, and third pads 311, 312, and 313 of the first chip 31 may be substantially similar to that described with reference to FIG. 4. For example, the first coupling terminal 111 and the first pad 311 may be electrically connected to each other through the connection structure 5'. The connection structure 5' may be substantially equal or similar to that described with reference to FIG. 4. The second coupling terminal 112 and the second pad 312 may be electrically connected to each other through the first wire W1. The third coupling terminal 113 and the third pad 313 may be electrically connected to each other through the second wire W2.

The fourth coupling terminal 114 may be electrically connected to the first semiconductor chip 71. For example, the fourth coupling terminal 114 may be connected to the first semiconductor pad 711 through the third wire W3. Thus, the fourth coupling terminal 114 may be electrically connected to the first semiconductor chip 71.

The fifth coupling terminal 115 may be electrically connected to the second semiconductor chip 72. For example, the fifth coupling terminal 115 may be connected to the second semiconductor pad 721 through the fourth wire W4. Thus, the fifth coupling terminal 115 may be electrically connected to the second semiconductor chip 72.

One of the first, second, and third coupling terminals 111, 112, and 113 may be electrically connected to the first semiconductor chip 71. Another of the first, second, and third coupling terminals 111, 112, and 113 may be electrically connected to the second semiconductor chip 72. The remaining one of the first, second, and third coupling terminals 111, 112, and 113 may be electrically connected to the outer terminal 13. For example, one coupling terminal of the first, second, and third coupling terminals 111, 112, and 113 may be electrically connected to the fourth coupling terminal 114. Another coupling terminal of the first, second, and third coupling terminals 111, 112, and 113 may be electrically connected to the fifth coupling terminal 115.

For example, the first coupling terminal 111 may be electrically connected to the outer terminal 13, as depicted by a dotted line in FIG. 7. The second coupling terminal 112 may be connected to the fifth coupling terminal 115. For example, the second coupling terminal 112 may be electrically connected to the fifth coupling terminal 115 through the second inner interconnection line 192. The third coupling terminal 113 may be connected to the fourth coupling terminal 114. For example, the third coupling terminal 113 may be electrically connected to the fourth coupling terminal 114 through the first inner interconnection line 191. Accordingly, the first pad 311 of the first chip 31 may be electrically connected to the outer terminal 13. The second pad 312 of the first chip 31 may be electrically connected to the second semiconductor chip 72. The third pad 313 of the first chip 31 may be electrically connected to the first semiconductor chip 71. But the inventive concept is not limited to this example.

In a method of fabricating a semiconductor package according to an embodiment of the inventive concept and a semiconductor package fabricated thereby, not only the wires but also the connection structure may be used to electrically connect pads of the chips to coupling terminals of the substrate. Thus, it may be possible to reduce or prevent the incidence of a short circuit from being formed between the wires. The number of the pads connected to the substrate may be increased. Thus, a plurality of semiconductor chips may be stacked on a chip, and the semiconductor chips may be electrically connected to the chip thereunder. For example, in the case where one buffer chip is mounted on a substrate and a plurality of semiconductor chips are stacked on the buffer chip, each of the semiconductor chips may be connected to the buffer chip. In other words, even when the buffer chip is disposed below the semiconductor chips, it may be possible to connect the buffer chip to each of the semiconductor chips. Since the buffer chip is disposed at the lower level, it may be possible to reduce a total size of the semiconductor package.

In a method of fabricating a semiconductor package according to an embodiment of the inventive concept and a semiconductor package fabricated thereby, since each of semiconductor chips can be connected to one buffer chip, it may be possible to reduce a size of the semiconductor package and to increase a speed of the semiconductor package.

Figure 8:
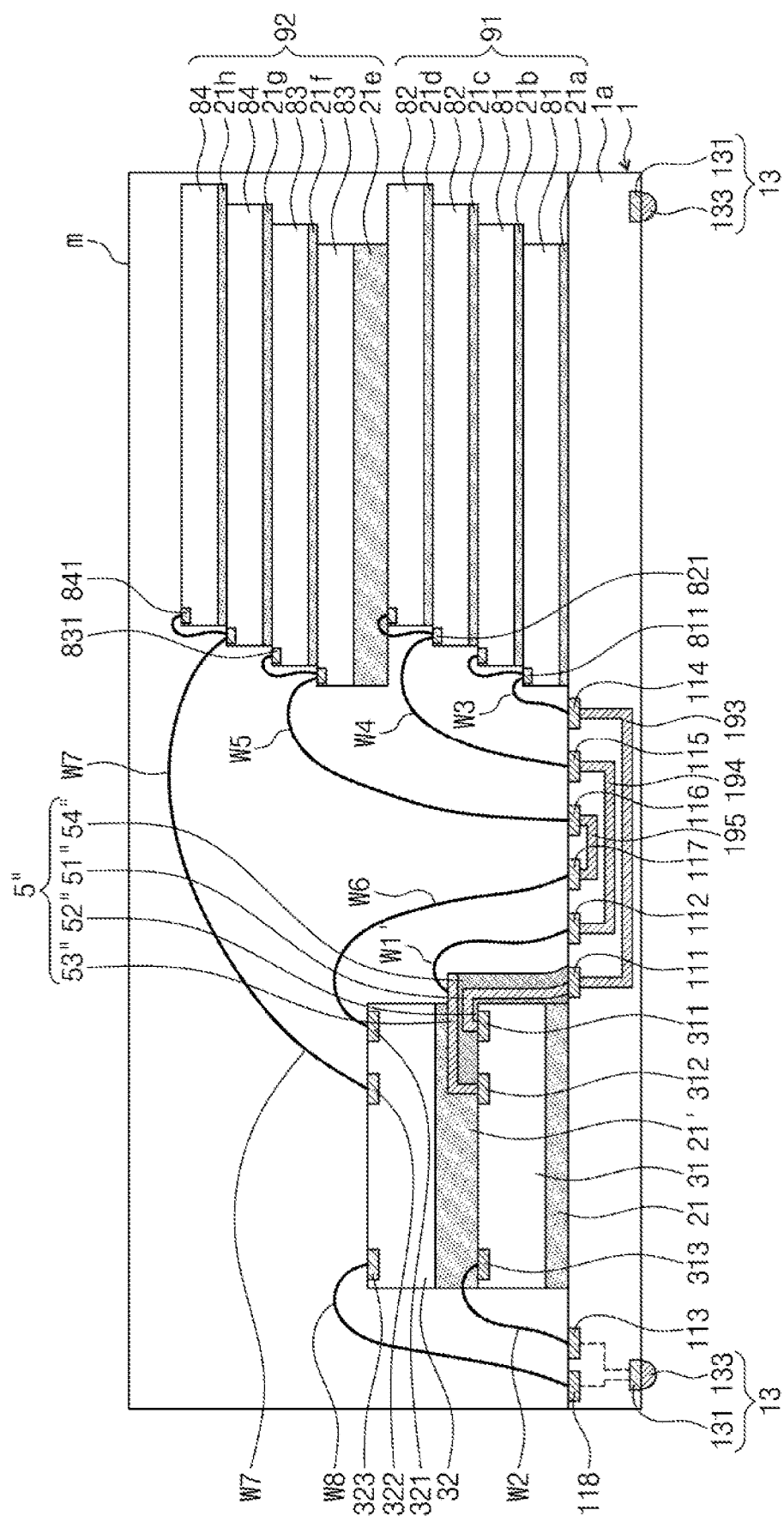
FIG. 8 is a structural diagram with sectional side view illustrating a semiconductor package according to an embodiment of the inventive concept.

FIG. 8 illustrates a semiconductor package according to an embodiment of the inventive concept.

In the following description, like elements described with reference to FIGS. 1 to 6 may be identified by the same or like reference numbers, without repeating an overlapping description thereof.

Referring to FIG. 8, the semiconductor package may include the first chip 31, the second chip 32, a first stack 91, a second stack 92, the substrate 1, the connection structure 5", the first wire W1' to the eighth wire W8, and/or the like.

The first chip 31 may be configured to have substantially similar features to the first chip described with reference to FIGS. 2A to 7, so duplicate description may be omitted. The second chip 32 may be placed on the first chip 31. For example, the second chip 32 may be stacked on the first chip 31, with the adhesive layer 21' interposed therebetween. The second chip 32 may further include a fourth pad 321, a fifth pad 322, and a sixth pad 323, which are provided near a top surface thereof. The second chip 32 may include a master chip or the like. The second chip 32 may include a buffer circuit provided therein. In this case, the second chip 32 may serve as a buffer chip.

The first stack 91 may be disposed on the substrate 1. The first stack 91 may be spaced apart from the first chip 31. For example, the first stack 91 may be horizontally spaced apart from the first chip 31. The first stack 91 may be electrically connected to the first chip 31. This may be described in greater detail below. The first stack 91 may include a first semiconductor chip 81 and a second semiconductor chip 82. The first semiconductor chip 81 may be disposed on the substrate 1. The first semiconductor chip 81 may be substantially similar to the first semiconductor chip described with reference to FIG. 7. The first semiconductor chip 81 may include a plurality of vertically stacked first semiconductor chips 81 or the like. The second semiconductor chip 82 may be disposed on the first semiconductor chip 81. The second semiconductor chip 82 may be substantially similar to the second semiconductor chip described with reference to FIG. 7. The second semiconductor chip 82 may include a plurality of vertically stacked second semiconductor chips 82 or the like.

In an embodiment, a stacking direction of the second semiconductor chip 82 may be shifted in the first direction. A stacking direction of the first semiconductor chip 81 may also be shifted in the first direction. In an alternate embodiment where the pad 114 or 115 is disposed at an opposite end of the semiconductor chip 81 or 82, respectively, a stacking direction of the semiconductor chip 81 or 82 may be shifted opposite to the first direction and/or opposite to the direction of the other of the first or second semiconductor chip, respectively, such as to redistribute wiring to both sides of the first stack 91. In an alternate embodiment where the pads 811 or 821 are disposed on an underside or lower surface of the semiconductor chip 81 or 82, respectively, a stacking direction of the semiconductor chip 81 or 82 may be shifted opposite to the first direction and/or opposite to the direction of the other of the first or second semiconductor chip, respectively such as to reduce a width of the first stack 91.

The second stack 92 may be disposed on the first stack 91. The second stack 92 may be electrically connected to the second chip 32. In the case where the second chip 32 is the master chip, the second stack 92 may be used as a slave chip for the second chip 32. This may be described in greater detail below. The second stack 92 may include a third semiconductor chip 83 and a fourth semiconductor chip 84. The third semiconductor chip 83 may include a third semiconductor pad 831. The third semiconductor pad 831 may be exposed to the outside through a top surface of the third semiconductor chip 83. In an embodiment, a plurality of the third semiconductor chips 83 may be provided. The third semiconductor chips 83 may be stacked in a vertical direction. The third semiconductor chips 83 may be attached to each other by the adhesive layer 21 interposed therebetween. The third semiconductor chips 83 may be stacked in a staircase shape in such a way that each of the third semiconductor chips 83 exposes the third semiconductor pad 831 thereunder.

For the sake of brevity, the description that follows will refer to one of the third semiconductor chips 83. The fourth semiconductor chip 84 may include a fourth semiconductor pad 841. The fourth semiconductor pad 841 may be exposed to the outside through a top surface of the fourth semiconductor chip 84. In an embodiment, a plurality of the fourth semiconductor chips 84 may be provided. The fourth semiconductor chips 84 may be stacked in a vertical direction. The fourth semiconductor chips 84 may be attached to each other by the adhesive layer 21 interposed therebetween. The fourth semiconductor chips 84 may be stacked in a staircase shape in such a way that each of the fourth semiconductor chips 84 exposes the fourth semiconductor pad 841 thereunder. For the sake of brevity, the description that follows will refer to one of the fourth semiconductor chips 84. In an alternate embodiment where wiring is distributed on both sides of the stack 92 and semiconductor chips 83 and 84 have semiconductor pads at opposite ends of their top surfaces, respectively, the third and fourth semiconductor chips 83 and 84 may be stacked in staircase shapes of opposite directions, respectively. In an alternate embodiment where semiconductor chips 83 and 84 are interleaved with one having its semiconductor pads at one end of a top surface and the other having its semiconductor pads at the same end of a bottom surface, the third and fourth semiconductor chips 83 and 84 may be stacked in a zig-zag shape such as to reduce stack width, for example.

The substrate 1 may include the first to eighth coupling terminals 111 to 118. The connection structure between the first to third coupling terminals 111 to 113 and the first to third pads 311 to 313 of the first chip 31 may be substantially similar to that described with reference to FIG. 6. In other words, the first pad 311 and the first coupling terminal 111 may be electrically connected to each other through the connection structure 5". The second pad 312 and the second coupling terminal 112 may be electrically connected to each other through the first wire W1'. The third pad 313 and the third coupling terminal 113 may be electrically connected to each other through the second wire W2.

The first semiconductor chip 81 may be electrically connected to one of the first, second, and third coupling terminals 111, 112, and 113 (e.g., 111 via coupling terminal 114). The second semiconductor chip 82 may be electrically connected to another of the first, second, and third coupling terminals 111, 112, and 113 (e.g., 112 via coupling terminal 115). The remaining one of the first, second, and third coupling terminals 111, 112, and 113 (e.g., 113) may be electrically connected to an outer terminal 13.

For example, as shown in FIG. 8, the first semiconductor chip 81 may be electrically connected to the first coupling terminal 111. The first semiconductor chip 81 may be connected to the fourth coupling terminal 114 through the third wire W3 connected to a first semiconductor pad 811, and the fourth coupling terminal 114 may be connected to the first coupling terminal 111 through a third inner interconnection line 193. In addition, the second semiconductor chip 82 may be electrically connected to the second coupling terminal 112. For example, the second semiconductor chip 82 may be connected to the fifth coupling terminal 115 through the fourth wire W4 connected to a second semiconductor pad 821, and the fifth coupling terminal 115 may be connected to the second coupling terminal 112 through a fourth inner interconnection line 194. In addition, the third coupling terminal 113 may be electrically connected to the outer terminal 13, as depicted by a dashed line.

However, the inventive concept is not limited to this example, and the first, second, and third coupling terminals 111, 112, and 113 may be connected to the first semiconductor chip 81, the second semiconductor chip 82, and the outer terminal 13 in various manners.

The third semiconductor chip 83 may be connected to a sixth coupling terminal 116 through the fifth wire W5. The sixth coupling terminal 116 may be connected to a seventh coupling terminal 117 through a fifth inner interconnection line 195. The seventh coupling terminal 117 may be connected to the fourth pad 321 of the second chip 32 through the sixth wire W6. Thus, the third semiconductor chip 83 may be electrically connected to the fourth pad 321. The fourth semiconductor chip 84 may be connected to the fifth pad 322 of the second chip 32 through the seventh wire W7. The sixth pad 323 of the second chip 32 may be connected to the eighth coupling terminal 118 through the eighth wire W8. The eighth coupling terminal 118 may be connected to the outer terminal 13. Thus, the second chip 32 may be electrically connected to the outer terminal 13.

In a method of fabricating a semiconductor package according to an embodiment of the inventive concept and a semiconductor package fabricated thereby, master chips for a plurality of stacks may themselves be stacked. Accordingly, it may be possible to reduce an area occupied by the master chip in the semiconductor package and to reduce a total size of the semiconductor package. Thus, the semiconductor package may be miniaturized.

According to an embodiment of the inventive concept, it may be possible to use an inner pad, which is provided between two pads placed at outer portions of a chip.

According to an embodiment of the inventive concept, it may be possible to prevent a short circuit from being formed between wires.

According to an embodiment of the inventive concept, it may be possible to reduce a size of a semiconductor package.

While exemplary embodiments of the inventive concept have been particularly shown and described, it will be understood by those of ordinary skill in the pertinent art that variations in form and detail may be made therein without departing from the spirit and scope of the present disclosure as defined by the attached claims.

What is claimed is:

1. A semiconductor package, comprising:
   a substrate including a first coupling terminal and a second coupling terminal;
   a first chip disposed on the substrate, the first chip including a first pad and a second pad;
   a connection structure connecting the first coupling terminal to the first pad;
   a first wire electrically connecting the second coupling to the second pad; and
   an adhesive layer disposed on a top surface of the first chip,
   wherein a portion of the connection structure is in contact with a first side surface of the first chip,
   wherein the connection structure comprises a connection conductor electrically connecting the first pad to the first coupling terminal,
   wherein a portion of the first wire and a portion of the connection structure are disposed in the adhesive layer.

2. The semiconductor package of claim 1, wherein:
   a distance between the first pad and the first side surface is smaller than a distance between the second pad and the first side surface, and
   a distance between the first coupling terminal and the first side surface is smaller than a distance between the second coupling terminal and the first side surface.

3. The semiconductor package of claim 1, wherein:
   the connection structure further comprises an inner insulator in contact with the first side surface, and
   the connection conductor is disposed on the inner insulator.

4. The semiconductor package of claim 1, further comprising:
   a second chip disposed on the first chip,
   wherein the adhesive layer is disposed between a bottom surface of the second chip and the top surface of the first chip.

5. The semiconductor package of claim 4, wherein the connection conductor comprises:
   an upper conductor connected to the first pad and disposed on the first chip; and
   a lower conductor, which is extended from the upper conductor, downwardly along the first side surface, and is connected to the first coupling terminal,
   wherein at least a portion of the upper conductor is disposed in the adhesive layer.

6. The semiconductor package of claim 4, wherein:
   the connection structure further comprises an outer insulator, which is disposed on the connection conductor, and a second connection conductor, which is disposed on the outer insulator and is connected to the second pad, the connection conductor and the second connection conductor are electrically insulated from each other by the outer insulator, and the second connection conductor electrically connects the second pad to the first wire.

7. The semiconductor package of claim 6, wherein:
the second connection conductor comprises a coupling portion, which is connected to the second pad, and an extended portion, which is extended from the coupling portion to an outside of the adhesive layer, and
the first wire is in contact with a portion of the extended portion exposed to the outside of the adhesive layer.

8. The semiconductor package of claim 1, wherein:
the substrate further comprises a third coupling terminal,
the first chip further comprises a third pad,
the second pad is disposed between the first pad and the third pad, and
the semiconductor package further comprises a second wire electrically connecting the third coupling terminal to the third pad.

9. A semiconductor package, comprising:
a substrate having a first coupling terminal, a second coupling terminal, and a third coupling terminal;
a first chip, disposed on the substrate, having a first pad electrically connected to the first coupling terminal, a second pad electrically connected to the second coupling terminal, and a third pad electrically connected to the third coupling terminal;
a first semiconductor chip disposed on the first chip; and
a second semiconductor chip disposed on the first semiconductor chip,
wherein the first coupling terminal and the first pad are connected to each other by a connection structure,
wherein the connection structure is formed by a printing process comprising at least one of an ink jet print process, an electro hydrodynamic jet print process, or an aerosol jet print process, and
wherein the connection structure comprises a connection conductor electrically connecting the first pad to the first coupling terminal.

10. The semiconductor package of claim 9, wherein:
the first semiconductor chip is electrically connected to the third coupling terminal by a first inner interconnection line in the substrate,
the second coupling terminal is electrically connected to the second pad by a first wire, and
the second semiconductor chip is electrically connected to the second coupling terminal by a second inner interconnection line in the substrate.

11. The semiconductor package of claim 10, wherein the substrate comprises an
outer terminal electrically connected to the first coupling terminal.

12. The semiconductor package of claim 9, the connection conductor comprising:
an upper conductor, which is connected to the first pad and is disposed on the first chip; and
a lower conductor, which is extended from the upper conductor, downwardly along a first side surface of the first chip, and is connected to the first coupling terminal,
wherein a portion of the connection structure comprising the lower conductor is in contact with the first side surface of the first chip.

13. The semiconductor package of claim 9, the substrate further comprising a fourth coupling terminal and a fifth coupling terminal, wherein:
the fourth coupling terminal is electrically connected to the first semiconductor chip,
the fifth coupling terminal is electrically connected to the second semiconductor chip,
each of the fourth and fifth coupling terminals is electrically connected to a corresponding one of two coupling terminals, which are selected from the first coupling terminal, the second coupling terminal, and the third coupling terminal.

14. A semiconductor package, comprising:
a substrate having a first coupling terminal, a second coupling terminal, and a third coupling terminal;
a first chip, disposed on the substrate, having a first pad electrically connected to the first coupling terminal, a second pad electrically connected to the second coupling terminal, and a third pad electrically connected to the third coupling terminal, wherein the second pad is disposed between the first pad and the third pad;
a second chip disposed on the first chip;
a first stack, which is horizontally spaced apart from the first chip and is electrically connected to the first chip, having a first semiconductor chip disposed on the substrate and a second semiconductor chip disposed on the first semiconductor chip; and
a second stack, which is disposed on the first stack and is electrically connected to the second chip,
wherein the first coupling terminal and the first pad are connected to each other by a connection structure,
wherein a portion of the connection structure is in contact with a first side surface of the first chip, and
wherein the connection structure comprises a connection conductor electrically connecting the first pad to the first coupling terminal.

15. The semiconductor package of claim 14, wherein:
the first semiconductor chip is electrically connected to one of the first, second, and third coupling terminals, and
the second semiconductor chip is electrically connected to another of the first, second, and third coupling terminals.

16. The semiconductor package of claim 15, the substrate comprising an outer terminal electrically connected to a remaining one of the first, second, and third coupling terminals.

17. The semiconductor package of claim 14, further comprising an adhesive layer disposed between a bottom surface of the second chip and a top surface of the first chip,
wherein the second coupling terminal is electrically connected to the second pad by the connection structure,
wherein a portion of the connection structure is disposed in the adhesive layer.

18. The semiconductor package of claim 17, wherein:
the connection structure further comprises an outer insulator, which is disposed on the connection conductor, and a second connection conductor, which is disposed on the outer insulator and is connected to the second pad,
the connection conductor and the second connection conductor are electrically insulated from each other by the outer insulator, and
the second connection conductor electrically connects the second pad to a first wire.

19. The semiconductor package of claim 18, wherein:
the second connection conductor comprises a coupling portion, which is connected to the second pad, and an extended portion, which is extended from the coupling portion to an outside of the adhesive layer, and
the first wire is in contact with the extended portion.

20. The semiconductor package of claim 14, wherein the connection structure is formed by a printing process comprising at least one of an ink jet print process, an electro hydrodynamic jet print process, or an aerosol jet print process.

* * * * *